(12) United States Patent
Cherubini et al.

(10) Patent No.: US 9,991,990 B1
(45) Date of Patent: Jun. 5, 2018

(54) SEQUENCE DETECTION

(71) Applicant: International Business Machines Corporation, Armonk, NY (US)

(72) Inventors: Giovanni Cherubini, Rueschlikon (CH); Roy Cideciyan, Rueschlikon (CH); Simeon Furrer, Altdorf (CH); Marcel Kossel, Reichenburg (CH); Hazar Yüksel, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/616,954

(22) Filed: Jun. 8, 2017

(51) Int. Cl.
*H03M 13/41* (2006.01)
*H04L 1/00* (2006.01)
*H04L 25/03* (2006.01)

(52) U.S. Cl.
CPC ........ *H04L 1/0054* (2013.01); *H03M 13/413* (2013.01); *H03M 13/4169* (2013.01); *H04L 1/0052* (2013.01); *H04L 25/03235* (2013.01)

(58) Field of Classification Search
CPC ................ H04L 1/0052; H04L 1/0054; H04L 25/03235; H03M 13/413; H03M 13/4169; H03M 13/6502
See application file for complete search history.

(56) References Cited

U.S. PATENT DOCUMENTS

| | | |
|---|---|---|
| 7,173,985 B1 | 2/2007 | Diaz-Manero |
| 7,564,930 B1 | 7/2009 | Diaz-Manero |
| 2002/0083396 A1* | 6/2002 | Azadet ................. H03M 13/03 714/796 |
| 2005/0268211 A1* | 12/2005 | Haratsch ........... H04L 25/03235 714/796 |
| 2009/0103659 A1* | 4/2009 | Chen ................. H03M 13/3938 375/341 |
| 2012/0151304 A1* | 6/2012 | Wu ..................... H03M 13/413 714/786 |

OTHER PUBLICATIONS

Benaissa et al., "A Novel High-Speed Configurable Viterbi Decoder for Broadband Access", EURASIP Journal on Applied Signal Processing 2003:13, 1317-1327.
Hekstra, Andries P., "An Alternative to Metric Rescaling in Viterbi Decoders" IEEE Transactions on Communications, vol. 37, No. 11, Nov. 1989, pp. 1220-1222.
Ungerboeck et al., "VLSI Architectures for Metric Normalization in the Viterbi Algorithm", 1990. ICC '90, Including Supercomm Technical Sessions. SUPERCOMM/ICC '90. Conference Record., Apr. 16-19, 1990, Atlanta, GA, USA, pp. 1723-1728.
Yi-Tse Lai, Kelvin, "An Efficient Metric Normalization Architecture for High-speed Low-power Viterbi Decoder", TENCON 2007, 2007 IEEE Region 10 Conference, Oct. 30-Nov. 2, 2007, 4 pages.

* cited by examiner

*Primary Examiner* — David B. Lugo

(74) *Attorney, Agent, or Firm* — David B. Woycechowsky

(57) ABSTRACT

Calculating path metrics, associated with respective states of an n-state trellis, by accumulating branch metrics in a sequence detector. Each path metric is represented by N bits plus a wrap-around bit for indicating wrap-around of the N-bit value of that path metric.

18 Claims, 4 Drawing Sheets

SEQUENCE DETECTION

BACKGROUND

The present invention relates generally to sequence detection, and more particularly to calculation of path metrics in sequence detectors for detecting symbol sequences transmitted over a channel.

Sequence detectors are used for detecting a sequence of data symbols communicated via an analog signal transmitted over a channel whose output is sampled at the receiver. For a given sample sequence obtained from a channel, the aim of such detectors is to determine the most likely symbol values for the symbol sequence supplied to the channel input. In data transmission, a sequence of input symbols drawn from a signal constellation is typically used to modulate some continuous waveform which is transmitted through a dispersive channel and sampled at the receiver. These samples would ideally equal the corresponding input symbols. However, they are corrupted by noise and interference with neighboring transmitted symbols. The latter phenomenon is commonly referred to as intersymbol interference (ISI). Sequence detectors such as Viterbi detectors (also called "Viterbi decoders") use recursive methods to determine the most probable input symbol sequence. Such detectors for high-speed data transmission play a vital role in designing receivers in compliance with recently approved communications standards, e.g. the IEEE P802.3bj standard for 100 Gb/s Ethernet, and upcoming communications standards, e.g. the IEEE P802.3bs standard for 400 Gb/s Ethernet.

Sequence detectors typically include a series of units which process successive input samples to select survivor paths through a trellis. For an n-state trellis, n survivor paths are selected, each corresponding to a possible sequence of symbol values for input samples processed thus far. The survivor paths are updated for each input sample and, at the end of the input sample sequence, one survivor path is selected as the optimum (i.e. most likely) path. This optimum path defines the detected sequence of symbol values. The detector units comprise a branch metric unit (BMU), a path metric unit (PMU), and a survivor memory unit (SMU). The BMU receives the input samples and calculates, for each input sample and each state of the trellis, branch metrics for possible transitions to that state corresponding to the input sample. This is done by computing hypothesized input values for the current input sample in a hypothesized value generator (HVG) of the BMU, and then comparing the input sample with the hypothesized values. Using the outcomes of these comparisons, the BMU derives the branch metrics for possible transitions to each state of the trellis for the current input sample. The PMU receives the branch metrics from the BMU and accumulates the branch metrics for each survivor path to obtain path metrics for each state of the trellis. This involves selection of an optimum path metric for each state from possible path metrics ("partial path metrics") computed using the branch metrics, and thus determines a latest symbol value in the survivor path to each state. These symbol decisions are stored in the SMU, where the survivor paths are updated in each time step until the final symbol decisions are output.

Normalization of the path metrics is required in sequence detectors if there is no state pinning in the encoder (i.e. periodic insertion of a known symbol in the transmitted symbol sequence so that the state at specific times is known to the detector). While state pinning is defined in the IEEE 802.3bj standard via use of "termination symbols", the IEEE P802.3bs standard has not adopted such a scheme. Normalization schemes are described in "An alternative to metric rescaling in Viterbi decoders", Hekstra, IEEE Trans. Commun., vol. 37, no. 11, pp. 1220-1222, November 1989, and "VLSI architectures for metric normalization in the Viterbi algorithm", Shung et al., IEEE Int. Conf. Commun., 1990, pp. 1723-1728. These schemes require use of two's complement representation for the binary signals in the detector.

To implement a sequence detector for high-speed data transmission, it is also important to be able to normalize the path metrics at the same data rate, and ideally with minimal extra circuitry in order to minimize area occupation, power consumption, and latency. These considerations are especially important when a transmission scheme with many encoder and/or channel states is adopted, such as that in the IEEE 802.3ab standard.

SUMMARY

According to at least one embodiment of the present invention there is provided a path metric unit for calculating path metrics, associated with respective states of an n-state trellis, by accumulating branch metrics in a sequence detector. Each path metric is represented by N bits plus a wrap-around bit for indicating wrap-around of the N-bit value of that path metric. The path metric unit includes a set of pipeline stages for receiving the branch metrics. This set of pipeline stages is adapted to select, for each state of the trellis, a pair of candidate path metrics from a set of partial path metrics, produced using the branch metrics, for that state. The path metric unit further comprises an output pipeline stage connected to receive the pair of candidate path metrics for each state and adapted to produce for that state a select signal, for selecting an optimum one of the pair as the path metric for that state, by comparing each of the N-bit values and the wrap-around bits of the pair. The candidate path metrics and select signal for each state are fed back from the output pipeline stage to the aforementioned set of pipeline stages. This set of stages is further adapted to produce pairs of speculative partial path metrics for each state by adding corresponding branch metrics to the pairs of candidate path metrics, and to select one of the aforementioned partial path metrics from each pair of speculative partial path metrics in dependence on the select signal for the candidate path metrics from which that pair was produced.

The use of N bits plus a wrap-around bit to represent each path metric provides inherent normalization of the path metrics when an N-bit value overflows, or "wraps around", e.g. when a calculated path metric exceeds $2^N-1$. This also permits simple generation of the select signal in the output pipeline stage by comparing the N-bit values and wrap-around bits of the candidate path metrics individually. Moreover, the addition operation required to compute partial path metrics by adding branch metrics is performed using the candidate path metrics fed back from the output pipeline stage. The correct partial path metrics can thus be immediately selected using the corresponding select signals computed in, and fed back from, the output stage for the candidates. The addition operation is thus performed in the set of pipeline stages while the select signals are calculated in the output stage. This significantly reduces the longest path in the PMU, allowing operation at higher data rates. This and additional advantages of embodiments of the invention are explained in more detail below.

The set of pipeline stages which selects the pair of candidate path metrics can also select these candidates from the partial path metrics for each state by comparing each of the N-bit values and the wrap-around bits of pairs of the partial path metrics and selecting an optimum (most likely) one of each pair until one pair remains as the pair of candidate path metrics for that state. The same process is thus used for selecting between a pair of partial path metrics as is used in the output stage for selecting between candidate path metrics. This offers a simple design in which functionally equivalent circuitry can be used in different stages.

In preferred embodiments, the set of pipeline stages includes, for each of the pairs of partial path metrics, a selection circuit for selecting the optimum one of the pair. This selection circuit comprises: a comparator and an inverting comparator connected for parallel comparison of the N-bit values of the pair; an XOR gate, connected in parallel with the comparators, for comparing the wrap-around bits of the pair; and a multiplexer circuit adapted to select the optimum one of the pair in dependence on outputs of the comparators and XOR gate. All comparison functions are then performed in parallel to further shorten the longest path.

The output stage may comprise a select-signal circuit for each state of the trellis. The select-signal circuit comprises: a comparator for comparing the N-bit values of the candidate path metrics for that state; an XOR gate, connected in parallel with the comparator, for comparing the wrap-around bits of the candidate path metrics for that state; and a multiplexer circuit adapted to produce the select signal in dependence on outputs of the comparator and XOR gate of this circuit. As discussed further below, a single comparator is used here to provide a simpler circuit.

In general, the aforementioned set of pipeline stages may comprise one or more stages. In a particularly efficient embodiment, the set of pipeline stages consists of a single stage adapted, for each state of the trellis, to produce four partial path metrics by selection thereof from respective pairs of speculative partial path metrics. This single pipeline stage may have two selection circuits, connected in parallel, to select the candidate path metrics from respective pairs of the partial path metrics. All comparisons needed to obtain the candidate path metrics are then done in parallel.

At least one further embodiment of the invention provides a sequence detector comprising a branch metric unit, a path memory unit as described above, and a survivor memory unit. The branch metric unit receives the input samples and is adapted to calculate, for each input sample and each state of an n-state trellis, branch metrics for respective possible transitions to that state corresponding to the input sample. The path memory unit is further adapted to select, for each state of the trellis, a latest symbol value in a survivor path to that state in dependence on the select signal for that state. The survivor memory unit is arranged to receive the latest symbol value in the survivor path to each state from the path metric unit and to select, at the end of the sequence of input samples, a survivor path corresponding to the sequence. With the path metric unit described, the input samples (and hence the branch and path metrics) can be represented in the detector by signed or unsigned binary values. In particular, using unsigned binary representation avoids the additional receiver circuitry needed to convert samples from the analog-to-digital converter at the channel output into two's complement representation.

Respective further embodiments of the invention provide methods for path metric calculation and sequence detection corresponding to apparatus described above. At least one additional embodiment of the invention provides a computer program product comprising a computer readable storage medium embodying program instructions, executable by a processing device, to cause the processing device to perform the path metric calculation method.

Some embodiments of the present invention may include one, or more, of the following features, characteristics, operations and/or advantages: (i) a method for detecting symbol values corresponding to a sequence of input samples produced from an analog signal transmitted over a channel and sampled at the channel output; (ii) receiving the input samples and calculating, for each input sample and each state of an n-state trellis, branch metrics for respective possible transitions to that state corresponding to the input sample; (iii) calculating path metrics for each state of the trellis by a method as described, below, and selecting for each state a latest symbol value in a survivor path to that state in dependence on said select signal for that state; (iv) updating the survivor path to each state in dependence on said latest symbol value in that survivor path and selecting, at the end of said sequence of input samples, a survivor path corresponding to said sequence; (v) the set of pipeline stages consists of a single pipeline stage; (vi) a computer program product for calculating path metrics, associated with respective states of an n-state trellis, by accumulating branch metrics during sequence detection, said computer program product comprising a computer readable storage medium having program instructions embodied therein; (vii) represent each path metric by N bits plus a wrap-around bit for indicating wrap-around of the N-bit value of that path metric; (viii) receive said branch metrics and, in a set of pipeline stages, select for each state of the trellis a pair of candidate path metrics from a set of partial path metrics, produced using said branch metrics, for that state; (ix) in an output pipeline stage, receive said pair of candidate path metrics for each state and produce for that state a select signal, for selecting an optimum one of the pair as the path metric for that state, by comparing each of the N-bit values and the wrap-around bits of the pair; (x) feedback said candidate path metrics and select signal for each state from the output pipeline stage to said set of pipeline stages and therein produce pairs of speculative partial path metrics for each state by adding corresponding branch metrics to the pairs of candidate path metrics, and selecting a said partial path metric from each pair of speculative partial path metrics in dependence on the select signal for the candidate path metrics from which that pair was produced; and/or in the set of pipeline stages, selecting the pair of candidate path metrics for each state from the partial path metrics for that state by comparing each of the N-bit values and the wrap-around bits of pairs of the partial path metrics and selecting an optimum one of each pair until one pair remains as the pair of candidate path metrics for that state.

Embodiments of the invention will be described in more detail below, by way of illustrative and non-limiting example, with reference to the accompanying drawings.

DETAILED DESCRIPTION

Figure 1:
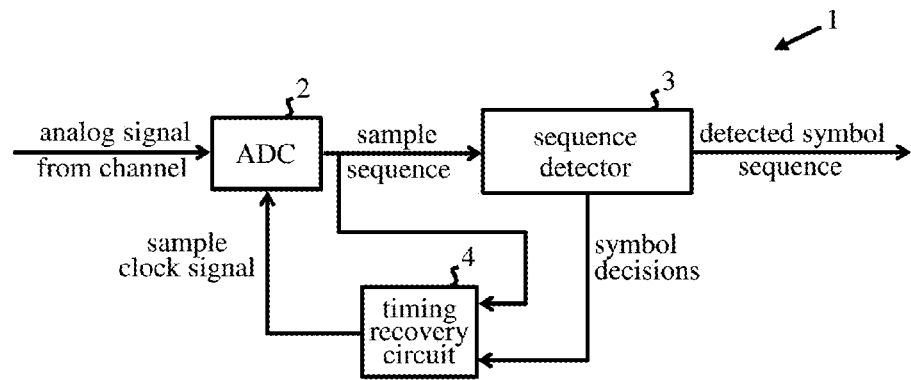
FIG. 1 is a schematic representation of receiver apparatus embodying the invention.
Figure 2:
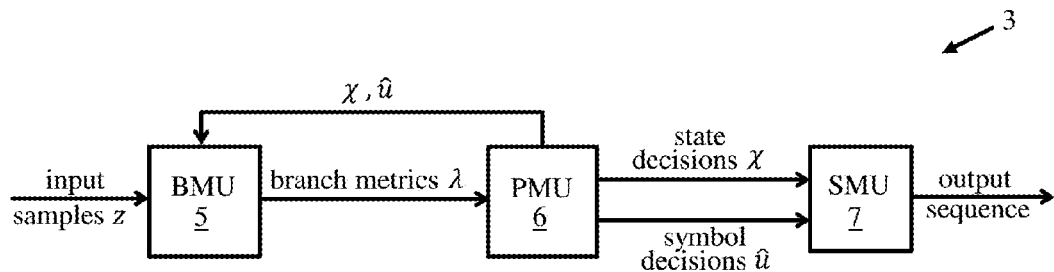
FIG. 2 is a schematic representation of a sequence detector of the receiver apparatus.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The block diagram FIG. 1 shows the key components of receiver apparatus embodying the invention. The receiver apparatus 1 comprises an analog-to-digital converter (ADC) 2, a sequence detector 3 and a timing recovery circuit 4. The ADC 2 receives an analog signal from the output of an ISI channel, and samples the signal to produce a sequence of samples which is supplied to sequence detector 3. Sample timing in the ADC is controlled by a sample clock signal from timing recovery circuit 4. The sequence detector 3 processes the input samples as detailed below to detect symbol values corresponding to the sample sequence. After processing all input samples, the sequence detector outputs a detected symbol sequence corresponding to the most-likely sequence of symbols supplied to the channel input. Symbol decisions made during operation of sequence detector 3 are fed back to timing recovery circuit 4 which also receives the signal samples from ADC 2. The timing recovery circuit processes the input samples and corresponding symbol decisions to determine a timing error for the sampling phase of the ADC. The timing error can be detected in known manner, for example using Mueller-Muller timing error detection. The sample clock signal is then adjusted based on the detected timing error to correct sample timing in the ADC.

The sequence detector 3 implements a recursive algorithm for detecting the most-probable input symbol sequence to the channel. The Viterbi algorithm is commonly used as the recursive method here. In the embodiment described below, sequence detector 3 uses the Viterbi algorithm to implement a Viterbi detector.

Figure 3:
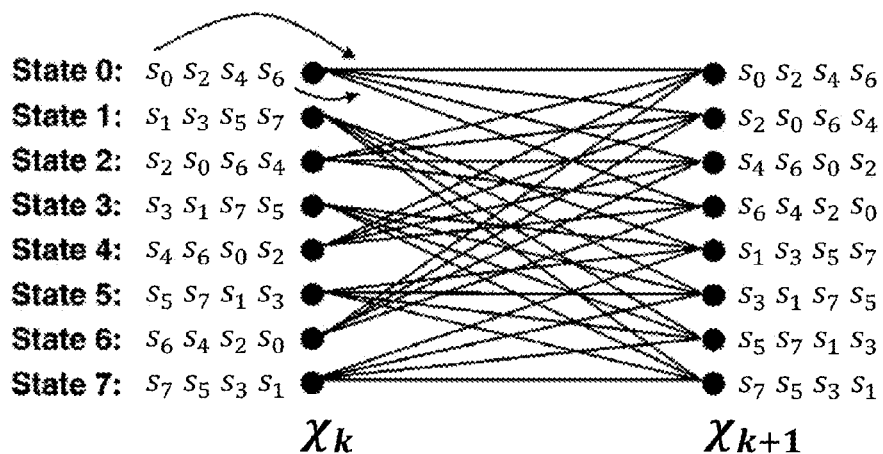
FIG. 3 shows a trellis diagram for use in an embodiment of the sequence detector.

FIG. 3 is a simplified block diagram of sequence detector 3 showing the basic component units of the detector. The sequence detector comprises a branch metric unit (hereinafter "BMU") 5, a path metric unit (hereinafter "PMU") 6 and a survivor memory unit (hereinafter "SMU") 7. The BMU 5 receives successive input samples z and calculates, for each input sample z and each state $\chi=0, 1, \ldots n-1$ of an n-state trellis, branch metrics $\lambda$ for respective possible transitions to that state corresponding to the input sample. The PMU 6 receives the branch metrics $\lambda$ from BMU 5, and accumulates the branch metrics for a survivor path to each state $\chi$ of the trellis to obtain path metrics for each state. This involves, for each input sample, updating of previous path metrics by addition of current branch metrics to obtain the partial path metrics for each state, and then selecting an optimum (e.g. smallest) path metric from the partial path metrics for each state. The optimum path metric for each state corresponds to the most likely path to that state. This optimum path metric thus decides the preceding state $\chi$ in the current survivor path to the state, and also the latest symbol value û in that survivor path. The state decisions $\chi$ and symbol decisions û are output to SMU 7 which updates the n survivor paths accordingly. (The state decisions $\chi$ and symbol decisions û are also fed back to BMU for use in selection of hypothesized symbol values discussed below, and branch metrics computed therefrom, which are consistent with known transitions in the survivor paths through the trellis). At the end of the input sample sequence, the SMU 7 selects an optimum (most likely) one of the n survivor paths, e.g. the survivor path with the smallest path metric. This optimum path defines the detected symbol sequence output by SMU 7.

The component units 5, 6 and 7 of sequence detector 3 are implemented as a series of pipeline stages which process input samples in a succession of time-steps $k=0, 1, \ldots (K-1)$ corresponding to a sequence of K input samples $z_k$. The BMU 5 can be implemented in known manner to generate branch metrics $\lambda_k$ corresponding to each input sample $z_k$ for each state of the trellis. A brief description of BMU operation is given below to assist understanding of the PMU operation described later.

An ISI channel has a discrete-time impulse response with L+1 channel coefficients where L>0. In particular, the channel is modelled by its discrete-time impulse-response sequence $h=(h_0, h_1, \ldots, h_L)$ where L is the number of interfering channel coefficients (channel memory). For a symbol $u_k$ input to the channel at time k, the corresponding channel output $y_k$ can be expressed as $y_k=\Sigma_{i=0}^{L} h_i u_{k-i}$ and is thus a function of $u_k$ and the L previous symbols $u_{k-i}$ to $u_{k-L}$. This output is corrupted by additive white Gaussian noise (AWGN) $w_k$, whereby the resulting input sample at sequence detector 1 is given by $z_k=y_k+w_k$. The BMU 5 receives each input sample $z_k$ and also receives the channel coefficient vector $h=(h_0, h_1, \ldots, h_L)$ described above. For each input sample $z_k$, the coefficient vector h is used to produce hypothesized input values in a hypothesized value generator (hereinafter "HVG") of the BMU. For example, with two post-cursor per-survivor decision-feedback taps $\{h_1, h_2\}$, i.e. L=2, the HVG constructs hypothesized input values, denoted by $z_k^h$, by taking the inner product of the symbols $\hat{u}_{k-1}, \hat{u}_{k-2}$ in each survivor path with the post-cursor discrete-time channel impulse-response sequence $\{h_1, h_2\}$ and adding $h_0 u_k$ to the result, i.e. $z_k^h=u_k+h_1\hat{u}_{k-1}+h_2\hat{u}_{k-2} \forall u_k \in A$ (where A is the symbol constellation of the transmission scheme and we assume here, without loss of generality, that the main-cursor tap $h_0=1$). The hypothesized input values $z_k^h$ are what the input sample $z_k$ would be for a certain permutation of transmitted input symbols $\{u_k, u_{k-1}, u_{k-2}\}$ in the absence of noise.

The BMU 5 compares each input sample $z_k$ with the hypothesized input values $z_k^h$ and selects, using the outcomes of such comparisons for each state $\chi_{k+1}$ of the trellis, an optimum (e.g. smallest) branch metric $\lambda_k$ for each possible transition to that state from the preceding state $\chi_k$. The branch metrics may be calculated, for example, as:

$$\lambda_k(\chi_k,\chi_{k+1})=(z_k-z_k^h)^2,$$

for $z_k^h$ consistent with previous state and symbol decisions in the survivor paths. In general, however, a branch metric $\lambda_k$ always represents distance between an input sample and a hypothesized value, and is thus by definition a positive value. Hence, a branch metric can be conveniently represented in unsigned binary format.

The branch metrics $\lambda_k$ calculated for each state of the trellis are supplied by BMU 5 to PMU 6. Operation of PMU 6 will be described below for an exemplary trellis with n=8 states shown in FIG. 3. (As will be understood by those skilled in the art, the states here may be states of a full-state trellis or states (sub-states) of a reduced state trellis). The eight trellis states are labelled 0 to 7 and the possible transitions for time-step k between states $\chi_k$ and $\chi_{k+1}$ are indicated by the transition lines in the figure. In this example, it is assumed that the modulation scheme permits transitions only from four of the eight states $\chi_k$ to any given state $\chi_{k+1}$ as indicated by the transition lines. The four transitions from each even-numbered state $\chi_k$ are labeled, in order from the top to the bottom line, either $s_0, s_2, s_4$ or $s_6$ in the left-to-right order indicated next to each state. The four transitions from each odd-numbered state $\chi_k$ are labeled, in order from the top to the bottom line, either $s_1, s_3, s_5$ or $s_7$ in the left-to-right order indicated next to each state. This gives corresponding labelling for transitions to each of the eight states $\chi_{k+1}$ as indicated next to those states. With this trellis, the BMU 5 outputs four branch metrics for respective possible transitions to each state $\chi_{k+1}$ of the trellis.

For $\chi_{k+1}=0$, the branch metrics $\lambda_k(\chi_k, \chi_{k+1}=0)$ are denoted by $\lambda_k(s_0)$, $\lambda_k(s_2)$, $\lambda_k(s_4)$ and $\lambda_k(s_6)$ according to the transition labels in FIG. 3. Four branch metrics $\lambda_k(s_0)$, $\lambda_k(s_2)$, $\lambda_k(s_4)$ and $\lambda_k(s_6)$ are similarly produced by BMU 5 for states $\chi_{k+1}=1$, $\chi_{k+1}=2$ and $\chi_{k+1}=3$. For each of states $\chi_{k+1}=4$ to $\chi_{k+1}=7$, the BMU outputs respective sets of branch metrics $\lambda_k(s_1)$, $\lambda_k(s_3)$, $\lambda_k(s_5)$ and $\lambda_k(s_7)$ corresponding to the trellis transitions to those states.

Figure 4:
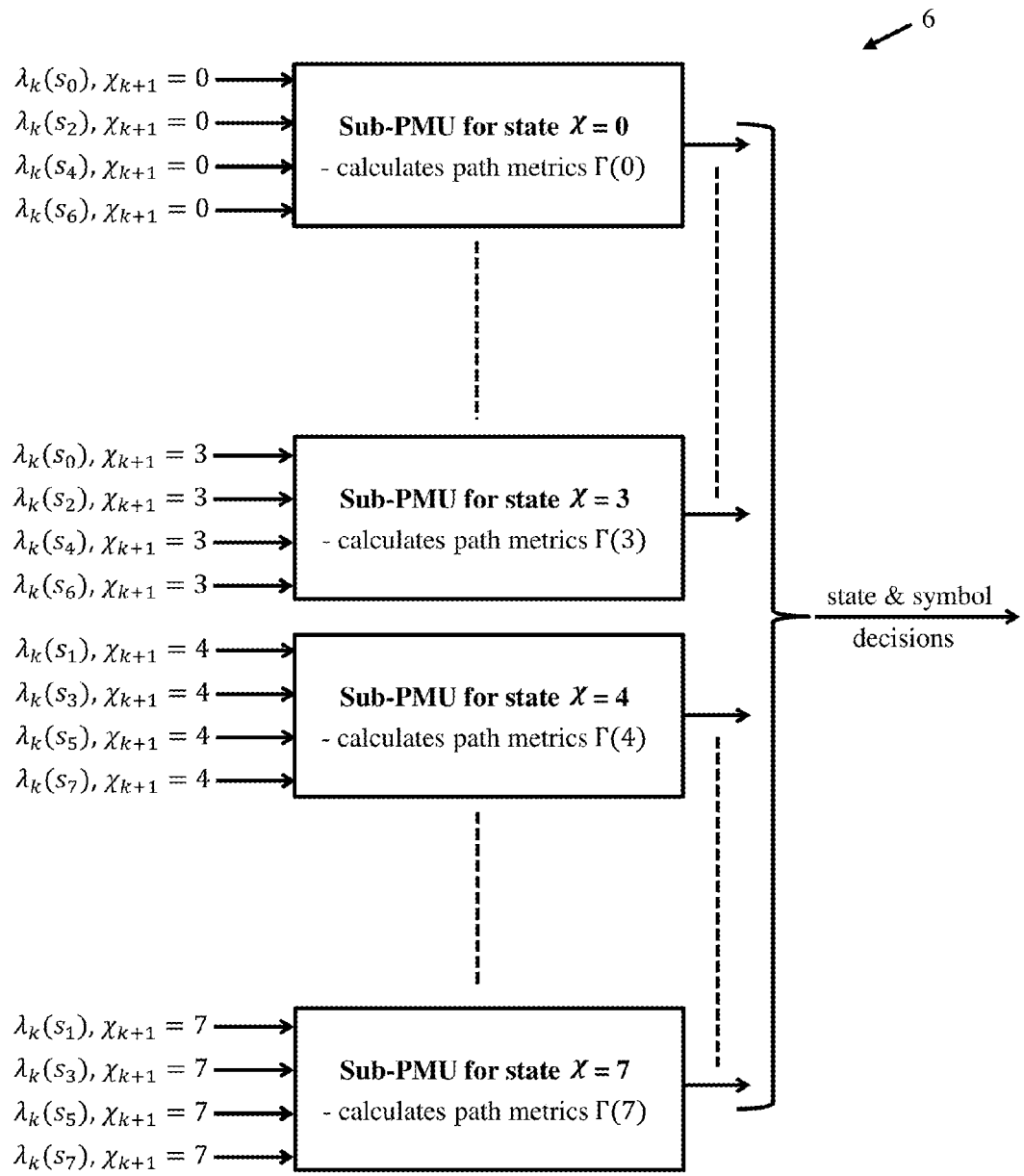
FIG. 4 illustrates structure of a path metric unit embodying the invention for use with the trellis of FIG. 3.

The PMU 6 of this embodiment is implemented as a set of eight sub-units ("sub-PMU's") as illustrated schematically in FIG. 4. In each time step k of the pipelined operation, each sub-PMU calculates the path metric, denoted by $\Gamma(\chi)$ in the figure, for a respective state $\chi=0$ to 7 of the trellis based on the corresponding set of branch metrics $\lambda_k$ input from BMU 5. As detailed below, each sub-PMU calculates path metrics by accumulating branch metrics in the survivor path to its respective state of the trellis. Briefly, each sub-PMU calculates a set of (here four) partial path metrics from which the final path metric to its state will be selected. Each partial path metric is calculated by adding one of the input branch metrics to the current path metric for the starting state in the trellis corresponding to that branch metric. The partial path metrics, denoted by $\Gamma_k(\chi_k, \chi_{k+1})$, for time step k are thus given by:

$$\Gamma_k(\chi_k, \chi_{k+1}) = \Gamma_k(\chi_k) + \lambda_k(\chi_k, \chi_{k+1})$$

where $\Gamma_k(\chi_k)$ is the path metric for state $\chi_k$. The sub-PMU then selects the optimum (here smallest) partial path metric as the path metric $\Gamma_{k+1}(\chi_{k+1})$ for its state $\chi_{k+1}$ after the current time step:

$$\Gamma_{k+1}(\chi_{k+1}) = \min_{\chi_k} \Gamma_k(\chi_k, \chi_{k+1}).$$

For example, $\Gamma_{k+1}(0)$ computed in the sub-PMU for $\chi=0$ is given by:

$$\Gamma_{k+1}(0) = \min(\Gamma_k(0,0), \Gamma_k(2,0), \Gamma_k(4,0), \Gamma_k(6,0).$$

In each sub-PMU, the selected path metric determines which transition $\chi_k \rightarrow \chi_{k+1}$ in the FIG. 3 trellis is most likely in the survivor path to state $\chi_{k+1}$, and thus decides on the latest symbol value $u_k$ in that survivor path as well as the preceding state $\chi_k$ in that path. The resulting state and symbol decisions from all sub-PMU's are output to SMU 7 as described above.

Like the branch metrics, the path metrics are always positive by definition. The path metric values can thus be conveniently represented in unsigned binary format. However, the path metrics as defined are unbounded, and would therefore require infinite resolution in the binary domain. It is therefore necessary to normalize the path metrics. Suppose that it is sufficient to represent the values of path metrics $\Gamma(\chi)$ by N bits. In PMU 6, each path metric $\Gamma(\chi)$ (and hence each partial path metric $\Gamma_k(\chi_k, \chi_{k+1})$) is represented by N bits ($b_1, b_2, \ldots b_N$) plus an extra, wrap-around bit (denoted here by $b_0$) for indicating wrap-around of the N-bit value of that path metric. A path metric can thus be represented in PMU 6 by $\Gamma(\chi) = (b_0, b_1, \ldots, b_N)$. All path metrics are set to the same value, conveniently zero, at time $k=0$, i.e. $\Gamma(\chi_0) = (0, 0, \ldots, 0)$. In this case, regardless of whether two's complement or unsigned binary representation is used, the extra wrap-around bit $b_0$ is set to zero at time $k=0$.

The PMU 6 (and hence each of the parallel sub-PMU's in FIG. 4) comprises a series of pipeline stages. In particular, PMU 6 includes a set of (one or more) pipeline stages which receives the branch metrics $\lambda$ and is adapted, for each state of the trellis, to produce a set of partial path metrics for that state using the branch metrics as described above. This set of stages is further adapted to select a pair of candidate path metrics from the resulting partial path metrics for each state. The set of pipeline stages is followed by an additional, output pipeline stage in which the path metric for each state is selected in each time step. The output pipeline stage is connected to receive the pair of candidate path metrics for each state and is adapted to produce for that state a select signal for selecting the optimum one of the pair as the path metric for that state. The candidate path metrics and select signal for each state are also fed back from the output pipeline stage to the preceding set of pipeline stages and used therein for calculation of the partial path metrics. Before describing detailed structure of the PMU, the main steps of the PMU operation will be explained with reference to the flow diagram of FIG. 5. (Note that steps of this figure do not correspond to time steps k of the pipelined operation which is explained in detail later. Also, some steps of this figure may be performed in a different order to that shown, and steps may be performed concurrently as appropriate.)

Figure 5:
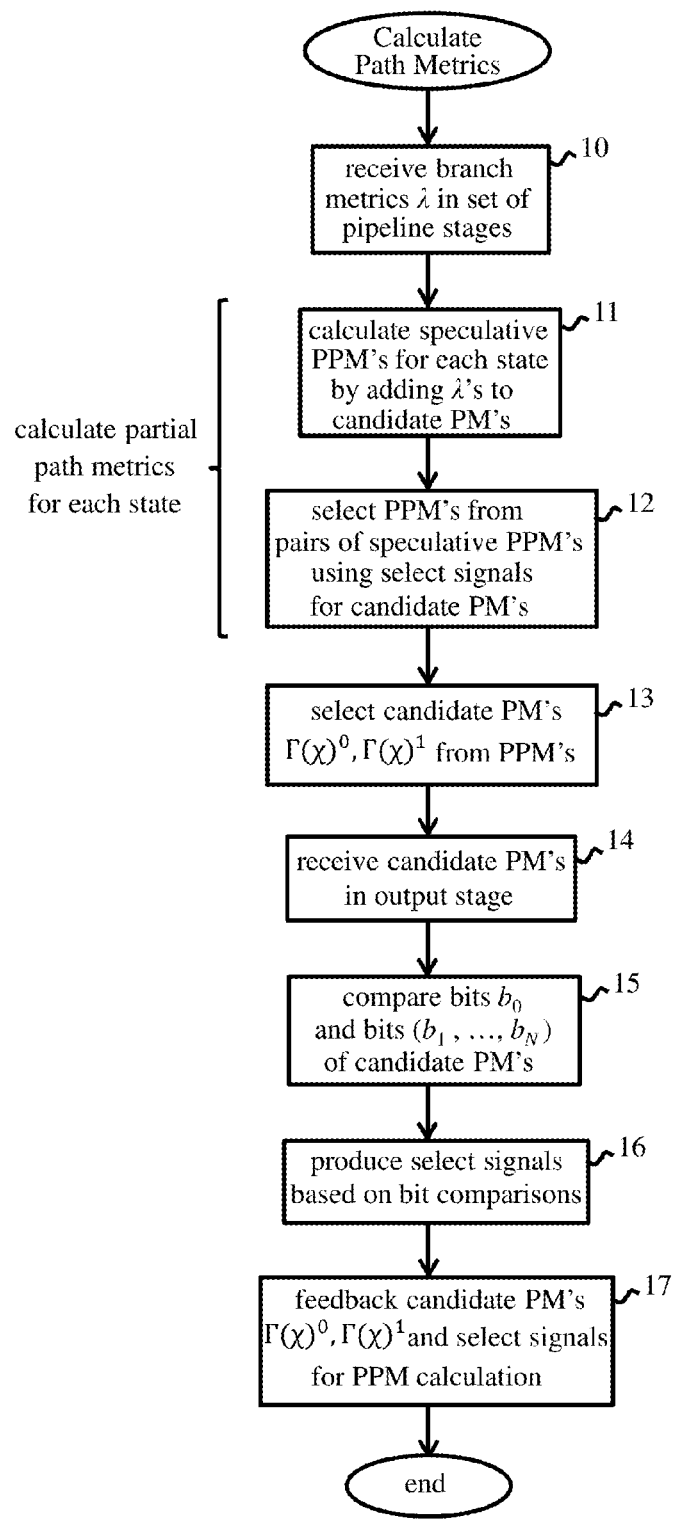
FIG. 5 indicates steps performed by the path metric unit of FIG. 4.

In step 10 of FIG. 5, the branch metrics $\lambda$ are input to the aforementioned set of pipeline stages of the PMU 6. The partial path metrics ("PPM's") for each state are then calculated over steps 11 and 12. In step 11, pairs of speculative partial path metrics are produced for each state by adding corresponding branch metrics to the pairs of candidate path metrics ("candidate PM's") fed back from the output pipeline stage. In step 12, a partial path metric is selected from each pair of speculative partial path metrics in dependence on the select signal, fed back from the output pipeline stage, for the candidate path metrics from which that pair was produced. In step 13, the pair of candidate PM's, denoted by $\Gamma^0(\chi)$ and $\Gamma^1(\chi)$, for each state of the trellis is then selected from the set of partial path metrics for that state. The candidate PM's $\Gamma^0(\chi)$ and $\Gamma^1(\chi)$ are selected as the two optimum (most likely), here smallest, partial path metrics for each state. In step 14, the candidate PM's $\Gamma^0(\chi)$, $\Gamma^1(\chi)$ are received by the output pipeline stage. In step 15, the output stage compares each of the N-bit values ($b_1, \ldots, b_N$) and the wrap-around bits $b_0$ of the pair of candidate PM's $\Gamma^0(\chi)$, $\Gamma^1(\chi)$ for each state. In step 16, the output stage generates, for each state $\chi$, the select signal for selecting the optimum (here smallest) one of the candidate PM's $\Gamma^0(\chi)$, $\Gamma^1(\chi)$ as the path metric $\Gamma(\chi)$ for that state. In step 17, the candidate PM's $\Gamma^0(\chi)$, $\Gamma^1(\chi)$ and select signal for each state are fed back from the output stage to the preceding set of stages for use in steps 11 and 12 in the operation of this set of stages.

The above PMU operation can be fully understood by considering operation of the sub-PMU for state $\chi=0$. The structure of this sub-PMU is shown in detail in FIG. 6. All other sub-PMU's have like structure, and each operates with the appropriate inputs for the particular state of the trellis for which that sub-PMU calculates path metrics. The corresponding inputs for all other sub-PMU's will be apparent to those skilled in the art from the description herein.

Figure 6:
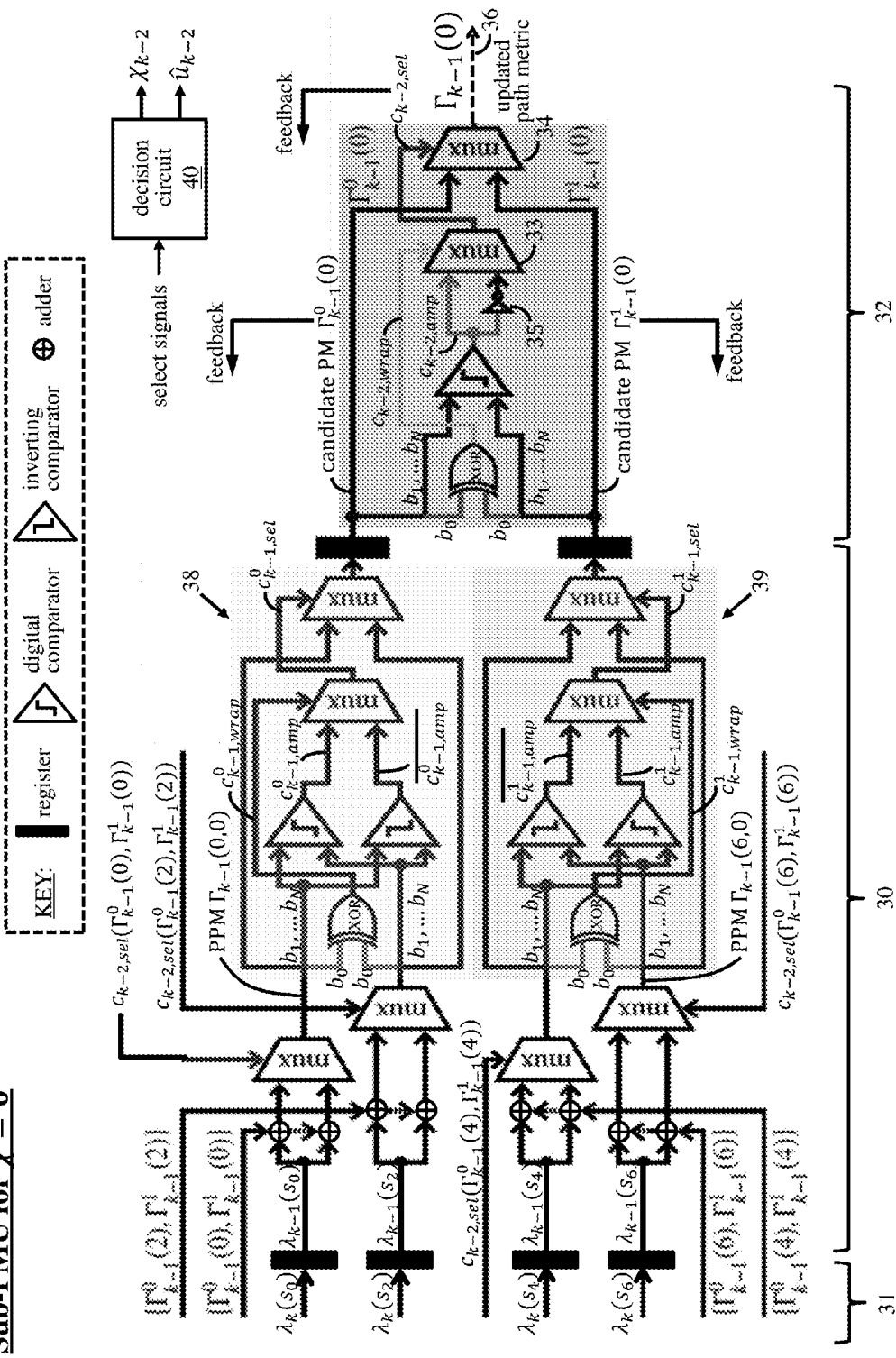
FIG. 6 shows more detailed structure of a sub-unit of the path metric unit.

In the FIG. 6 embodiment, the set of pipeline stages which calculates the speculative PPM's and then selects the PPM's and the candidate PM's consists of a single pipeline stage. This stage corresponds to the central pipeline stage 30 between the two banks of pipeline registers in the figure. Here, the sub-PMU also has an input pipeline stage 31 which receives the branch metrics $\lambda_k(s_0)$, $\lambda_k(s_2)$, $\lambda_k(s_4)$, $\lambda_k(s_6)$ for a time-step k from BMU 5. These branch metrics are delayed by one clock period by the first bank of pipeline registers and are supplied to the central pipeline stage 30 in the next clock period. As the branch metrics $\lambda_k(s_0)$ to $\lambda_k(s_6)$ are supplied to input pipeline stage 31, the central pipeline stage 30 thus receives the path metrics $\lambda_{k-1}(s_0), \lambda_{k-1}(s_2), \lambda_{k-1}(s_4), \lambda_{k-1}(s_6)$ for time-step k−1. This central stage calculates the four partial path metrics $$\Gamma_{k-1}(0,0), \Gamma_{k-1}(2,0), \Gamma_{k-1}(4,0) \text{ and } \Gamma_{k-1}(6,0),$$

and, from these, selects two candidate PM's $\Gamma_k^0(0)$ and $\Gamma_k^1(0)$ for state $\chi=0$. The pair of candidate PM's $\Gamma_k^0(0)$ and $\Gamma_k^1(0)$ are then stored by the second bank of pipeline registers. The sub-PMU circuit has an output pipeline stage 32 connected to the second bank of registers, for receiving the candidate PM's output in each time step. As the pair of candidate PM's $\Gamma_k^0(0)$ and $\Gamma_k^1(0)$ are calculated in the central stage, the output stage thus receives the candidate PM's $\Gamma_{k-1}^0(0)$ and $\Gamma_{k-1}^1(0)$ for time-step k−2. Output stage 32 selects the optimum one of the candidate PM's $\Gamma_{k-1}^0(0)$ and $\Gamma_{k-1}^1(0)$ as the path metric $\Gamma_{k-1}^0(0)$ and $\Gamma_{k-1}(0)$ for state $\chi_{k-1}=0$.

The output stage 32 of the sub-PMU is implemented here as a select-signal circuit. The select-signal circuit comprises a comparator, an XOR gate, and a multiplexer circuit, comprising two multiplexers ("mux") 33, 34 and an inverter 35, all connected as shown. In particular, the comparator receives the "amplitude bits" ($b_1, \ldots, b_N$) of the candidate PM's $\Gamma_{k-1}^0(0)$ and $\Gamma_{k-1}^1(0)$ and thus compares the N-bit values of the two candidate path metrics. The comparator outputs a 1-bit signal $c_{k-2,amp}$ whose value depends on the result of the comparison. The signal $c_{k-2,amp}$ is supplied to a first input of multiplexer 33. Inverter 35 also inverts $c_{k-2,amp}$ and supplies the inverted signal to a second input of multiplexer 33. The XOR gate of this circuit is connected in parallel with the comparator and receives the wrap-around bits $b_0$ of the candidate PM's $\Gamma_{k-1}^0(0)$ and $\Gamma_{k-1}^1(0)$. The XOR gate thus compares the wrap-around bits $b_0$ and outputs a 1-bit signal $c_{k-2,wrap}$ whose value depends on the result of the comparison. The signal $c_{k-2,wrap}$ is supplied to multiplexer 33 for determining which of its two inputs is supplied to the multiplexer output. This output of multiplexer 33 constitutes the select signal described above, denoted by $c_{k-2,sel}$, for selecting between the candidate PM's $\Gamma_{k-1}^0(0)$ and $\Gamma_{k-1}^1(0)$. In particular, these candidate PM's $\Gamma_{k-1}^0(0)$ and $\Gamma_{k-1}^1(0)$ provide respective inputs to the second multiplexer 34. The select signal $c_{k-2,sel}$ supplied to this multiplexer 34 determines which of its two inputs is supplied to the multiplexer output 36. The selected candidate $\Gamma_{k-1}^0(0)$ and $\Gamma_{k-1}^1(0)$ constitutes the optimum path metric $\Gamma_{k-1}(0)$ for state $\chi_{k-1}=0$.

Feedback connections, indicated schematically by arrows in FIG. 6, feed the candidate PM's $\Gamma_{k-1}^0(0)$ and $\Gamma_{k-1}^1(0)$ output by the second bank of registers, and the select signal $c_{k-2,sel}$ output by multiplexer 33, back from the output stage 32 to the central pipeline stage 30 of the PMU. These signals are fed back to multiple, appropriate ones of the eight sub-PMU's. In the sub-PMU shown here for state $\chi=0$, the central pipeline stage 30 receives the pairs of candidate PM's $\Gamma_{k-1}^0(\chi), \Gamma_{k-1}^1(\chi)$ from the output stage of the sub-PMU's for states $\chi=0, \chi=2, \chi=4,$ and $\chi=6$. These states correspond to the start states in the trellis for the branch metrics $\lambda_{k-1}(s_0), \lambda_{k-1}(s_2), \lambda_{k-1}(s_4), \lambda_{k-1}(s_6)$, input to central stage 30 of this sub-PMU. Each branch metric $\lambda_{k-1}(s_0), \lambda_{k-1}(s_2), \lambda_{k-1}(s_4), \lambda_{k-1}(s_6)$ is supplied to a respective pair of adders at the beginning of the central pipeline stage. The two adders of each pair also receive respective candidate PM's $\Gamma_{k-1}(\chi), \Gamma_{k-1}(\chi)$ as indicated in the figure. The adders of each pair thus add the corresponding branch metric to the input candidate PMs fed back from the output stage. Each pair of adders outputs a pair of speculative partial path metrics for time step k−1. For example, the adders of the top pair in the figure receive the candidate PM's $\Gamma_{k-1}^0(0)$ and $\Gamma_{k-1}^1(0)$ respectively, add the corresponding branch metric $\lambda_{k-1}(s_0)$, and output two speculative PPM's as:

$$\Gamma_{k-1}^0(0,0) = \Gamma_{k-1}^0(0) + \lambda_{k-1}(s_0) \text{ and}$$

$$\Gamma_{k-1}^1(0,0) = \Gamma_{k-1}^1(0) + \lambda_{k-1}(s_0)$$

The four multiplexers following the adder pairs receive the pairs of speculative PPM's at their inputs as shown. Each multiplexer also receives the corresponding select signal $c_{k-2,sel}$, produced by and fed back from output stage 32 of the PMU in the current time step, for selecting between the two speculative PPM's. In particular, each multiplexer selects one of its input pair of speculative PPM's to be supplied to the multiplexer output in dependence on the select signal $c_{k-2,sel}$ for the candidate PMs from which that pair was produced. The speculative PPM selected in each case provides one of the four PPM's $\Gamma_{k-1}(0,0), \Gamma_{k-1}(2,0), \Gamma_{k-1}(4,0), \Gamma_{k-1}(4,0)$ for time-step k−1. For instance, the PPM $\Gamma_{k-1}(0,0)$ is selected from $\Gamma_{k-1}^0(0,0)$ and $\Gamma_{k-1}^1(0,0)$ in dependence on the select signal $c_{k-2,sel}$ produced in output stage 32 of the illustrated sub-PMU for state $\chi=0$.

The subsequent circuitry in central pipeline stage 30 selects the candidate PM's from the resulting PPM's $\Gamma_{k-1}(0,0), \Gamma_{k-1}(2,0), \Gamma_{k-1}(4,0), \Gamma_{k-1}(4,0)$. This is again done by comparing each of the N-bit values and the wrap-around bits of pairs of the partial path metrics, and selecting an optimum one of each pair, until one pair remains as the pair of candidate path metrics for state $\chi=0$. In the present example with four PPM's per state, there are only two pairs of PPM's to be processed. For each pair, the central pipeline stage 30 includes a selection circuit for selecting the optimum one of the pair. The two selection circuits, indicated generally at 38 and 39, are connected in parallel as shown. Selection circuit 38 receives the pair of PPMs $\Gamma_{k-1}(0,0), \Gamma_{k-1}(2,0)$, and selection circuit 39 receives the pair of PPMs $\Gamma_{k-1}(4,0), \Gamma_{k-1}(6,0)$. Each selection circuit 38, 39 comprises a comparator and an inverting comparator which are connected in parallel, an XOR gate connected in parallel with the comparators, and a multiplexer circuit comprising two multiplexers, all connected as shown. In each selection circuit 38 and 39, the comparator and inverting comparator receive the amplitude bits ($b_1, \ldots b_N$) of the input PPM's and thus compare the N-bit values of the PPM's. The comparator in each circuit outputs a 1-bit signal $c_{k-1,amp}^0$ (circuit 38) or $c_{k-1,amp}^1$ (circuit 39) whose value depends on the result of the comparison. The inverting comparator outputs the inverse of this 1-bit signal, i.e. $\overline{c_{k-1,amp}^0}$ (circuit 38) or $\overline{c_{k-1,amp}^1}$ (circuit 39). The signals $c_{k-1,amp}^0$ and $\overline{c_{k-1,amp}^0}$ in circuit 38, and $c_{k-1,amp}^1$ and $\overline{c_{k-1,amp}^1}$ in circuit 39, are supplied to respective inputs of the first multiplexer in that circuit. The XOR gate of each circuit receives the wrap-around bits $b_0$ of the input PPM's. The XOR gate thus compares the wrap-around bits $b_0$ and outputs a 1-bit signal $c_{k-1,wrap}^0$ (circuit 38) or $c_{k-1,wrap}^1$ (circuit 39) whose value depends on the result of the comparison. The signal $c_{k-1,wrap}^0$ or $c_{k-1,wrap}^1$ in each circuit is supplied to the first multiplexer of that circuit and determines which of its two inputs is supplied to the multiplexer output. The output of this multiplexer constitutes a select signal, denoted here by $c_{k-1,sel}^0$ (circuit 38) or $c_{k-1,sel}^1$ (circuit 39) for selecting the candidate PM's, $\Gamma_k^0(0)$ or $\Gamma_k^1(0)$ respectively. In particular, the pair of PPM's input to each circuit 38, 39 provide respective inputs to the second multiplexer in that circuit. The signal $c_{k-1,sel}^0$ or $c_{k-1,sel}^1$ determines which of the two input PPMs each multiplexer outputs as the candidate PM $\Gamma_k^0(0)$ or $\Gamma_k^1(0)$. These are output to the pipeline registers as already described, and the operation continues recursively as before.

The operation of the selection circuits 38, 39 and the select-signal generation circuit of output stage 32 in each sub-PMU is functionally equivalent (the slight difference in circuit design for the output stage is explained below). The rules determining the bit values of the signals output by the comparators, XOR gates and multiplexers of these circuits can be generalized as follows.

With the trellis of FIG. 3, there are four competing PPMs $\Gamma_k(\chi_k, \chi_{k+1})$ to become the path metric in the next time step for a given state, e.g.:

$$\Gamma_{k+1}(0) = \min(\Gamma_k(0,0), \Gamma_k(2,0), \Gamma_k(4,0), \Gamma_k(6,0)$$

We define:

$$\Gamma_{k,0i}(\chi_k, \chi_{k+1}) = (b_0, \ldots, b_i) 0 \leq i \leq N$$

For a state $\chi_{k+1}$ in the trellis, the comparison function for the wrap-around bits (implemented by the XOR gates) is defined by:

$$c_{k,wrap}(\zeta_k, \phi_k) = \begin{cases} 0, & \text{if } \zeta_{k,00} = \phi_{k,00} \\ 1, & \text{otherwise} \end{cases}$$

where both $\zeta_k$ and $\phi_k$ represent a PPM $\Gamma_k(\chi_k, \chi_{k+1})$ corresponding to an allowed transition from state $\chi_k$ to state $\chi_{k+1}$, or a candidate PM $\{\Gamma_{k+1}^0(\chi_k), \Gamma_{k+1}^1(\chi_k)\}$.

The comparison function for the N amplitude bits (implemented by the comparators) is defined by:

$$c_{k,amp}(\zeta_k, \phi_k) = \begin{cases} 1, & \text{if } \zeta_{k,1N} \leq \phi_{k,1N} \\ 0, & \text{otherwise} \end{cases}.$$

The function for generating the select signals (implemented by the inverting comparators and first multiplexer of circuits 38 and 39, and by the inverter 35 and first multiplexer 33 of output stage 32) is defined by:

$$c_{k,sel}(\zeta_k, \phi_k) = \begin{cases} c_{k,amp}(\zeta_k, \phi_k), & \text{if } c_{k,wrap}(\zeta_k, \phi_k) = 0 \\ \overline{c_{k,amp}}(\zeta_k, \phi_k), & \text{otherwise,} \end{cases}$$

where $\overline{c_{k,amp}}(\zeta_k, \phi_k)$ denotes the logical complement of $c_{k,amp}(\zeta_k, \phi_k)$.

In each sub-PMU, a candidate PM is chosen in the second multiplexer of circuit 38 as:

$$\Gamma_{k+1}^0(\chi_{k+1}) = \begin{cases} \zeta_k, & \text{if } c_{k,sel}(\zeta_k, \phi_k) = 1 \\ \phi_k, & \text{otherwise.} \end{cases}$$

The other candidate PM $\Gamma_{k+1}^1(\chi_{k+1})$ chosen in parallel in the second multiplexer of circuit 39. The path metric $\Gamma_{k+1}(\chi_{k+1})$ is chosen in the output stage by applying the candidate PM's $\Gamma_{k+1}^0(\chi_{k+1})$ and $\Gamma_{k+1}^1(\chi_{k+1})$ as inputs $\zeta_k$ and $\phi_k$ to the rules procedure described above. The complete procedure for the PM calculation is expressed in the following algorithm.

Path Metric Update for FIG. 3 Trellis.

Input: $\Gamma_k(\chi_k, \chi_{k+1})$;

Output: $\Gamma_{k+1}(\chi_{k+1})$;

Initialization
1. τ←0;
   Calculate Candidate Path Metrics
2. for k=0 to K−1 do
3. for $\chi_{k+1}$=0 to 7 do
4. τ←0;
5. for $\chi_k \in \{\lfloor\chi_{k+1}/4\rfloor, \lfloor\chi_{k+1}/4\rfloor+4\}$ do
6. $\zeta_k \leftarrow \Gamma_k(\chi_k, \chi_{k+1})$;
7. $\phi_k \leftarrow \Gamma_k(\chi_k+2, \chi_{k+1})$;
8. $\chi_{k+1}^\tau(\chi_{k+1}) \leftarrow$ pathMetricComparison($\zeta_k, \phi^k$);
9. τ←τ+1;
10. end for
11. end for
    Path Metric Update after Pipelining (in PMU Output Stage)
12. For $\chi_k$=0 to 7 do
13. $\zeta_k \leftarrow \Gamma_k^0(\chi_k)$;
14. $\phi_k \leftarrow \Gamma_k^1(\chi^k)$;
15. $\Gamma_k(\chi_k) \leftarrow$ pathMetricComparison($\zeta_k, \phi_k$);
16. end for
17. end for
    Comparison of Two Partial or Candidate Path Metrics
18. function pathMetricComparison($\zeta_k, \phi_k$)
19. if ($\zeta_{k,1N} \leq \phi_{k,1N}$) then
20. $c_{k,amp}(\zeta_k, \phi_k) \leftarrow 1$;
21. else
22. $c_{k,amp}(\zeta_k, \phi_k) \leftarrow 0$;
23. end if
24. if ($\zeta_k, \phi_{k,00}$) then
25. $c_{k,sel}(\zeta_k, \phi_k) \leftarrow c_{k,amp}(\zeta_k, \phi_k)$;
26. else
27. $c_{k,sel}(\zeta_k, \phi_k) \leftarrow \overline{c_{k,amp}}(\zeta_k, \phi_k)$;
28. end if
29. if ($c_{k,sel}(\zeta_k, \phi_k)$=1) then
30. $\Gamma_{k+1} \leftarrow \zeta_k$;
31. else
32. $\Gamma_{k+1} \leftarrow \phi_k$;
33. end if
34. return $\Gamma_{k+1}$;

Returning to FIG. 6, the selected path metric $\Gamma_{k-1}(0)$ for state $\chi_{k-1}$=0 determines the preceding state $\chi_{k-2}$ in the updated survivor path to state $\chi_{k-1}$=0, and also the latest symbol value $\hat{u}_{k-2}$ in that survivor path. As indicated schematically in the figure, a decision circuit 40 of the sub-PMU can thus select the correct decisions for $\chi_{k-2}$ and $\hat{u}_{k-2}$, from the possible values in each case, based on the select signals, $c_{k-2,set}^0$, $c_{k-2,set}^1$ and $c_{k-2,sel}$ from stages 30 and 32 for $\chi_{k-1}$=0. The PMU sub-units can thus collectively select, for all n states of the trellis, the latest symbol values in the survivor paths to the n-states in dependence on the select signals for those states.

The state and symbol decisions from all sub-PMU's in each time step are supplied to SMU 7 for updating the n survivor paths accordingly. SMU 7 can be implemented in known manner, e.g. as a register exchange unit or a traceback unit, to store the survivor paths. At the end of the input sample sequence, the SMU then outputs the detected symbol sequence corresponding to the optimum (most likely) survivor path. As described earlier, the symbol decisions from PMU 6 are also fed back to timing recovery circuit 4 of receiver 1 for timing error detection.

As indicated by dashed output 36 in FIG. 6, the updated path metrics may or may not be output by the PMU sub-units. If sequence detector 3 is implemented as a detector (often called a "hard-decision detector") which only outputs symbol decisions, the updated path metrics need not be output. However, they may be used in a detector (often called a "soft-decision detector") as a reliability measure for symbol decisions as will be apparent to those skilled in the art.

The use of N amplitude bits ($b_1, b_2, \ldots b_N$) plus the wrap-around bit $b_0$ in the PMU operation above provides inherent normalization of the path metrics. For example, when an N-bit value exceeds $2^N-1$, this is indicated by a bit-flip of wrap-around bit $b_0$ and thus accommodated in the comparison rules above. This allows the path metrics to be normalized without external intervention to the operation of the path metric unit. The comparison operations can be readily performed by simple, functionally equivalent circuits throughout. Most importantly, it will be seen that the addition operation required to compute the speculative PPM's is performed, using the candidate PM's fed back from the output pipeline stage, at the same time as the select signal for choosing between those candidates is generated in the output stage. The correct PPM's can thus be immediately selected from the speculative PPM's using the corresponding select signals computed in, and fed back from, the output stage for the candidates. This significantly reduces the propagation delay of the longest path, which determines the highest achievable data rates, in the PMU. (The longest path is the path containing the addition operations, and thus corresponds to central pipeline stage 30 above). In particular, the propagation delay of the longest path is reduced by that of the output stage circuitry. In addition, the use of an inverting comparator in parallel with the comparator in circuits 38, 39 of the central PMU stage avoids the need for an inverter at the output of the comparator. This further reduces the propagation delay of the longest path by that of an inverter. The inverter 35 is used in the output stage, which does not contribute to the longest path, to simplify the output stage circuitry.

The PMU of this embodiment provides a high-speed PMU with embedded normalization, allowing the sequence detector to accommodate higher data rates. This is achieved with simple circuitry using repeated, functionally-equivalent circuits in the PMU stages. These features are especially advantageous when a transmission scheme with many encoder and/or channel states is adopted. The PMU does not require state pinning and does not otherwise require a specific transmission scheme for its operation. The PMU can operate with or without a coded or coded-modulation scheme, such as the TCM (Trellis-Coded Modulation), and the principles described can be applied with any number of encoder and/or channel states. A specific modulation scheme, such as two-level pulse-amplitude modulation (2-PAM) is not required, i.e., multi-level signaling can be exploited with the PMU. In addition, the use of two's complement representation for input samples is not required for detector operation. While two's complement representation may be used if desired, in general signed or unsigned binary values may be used in the detector. Using unsigned binary representation for the input samples (and hence the branch and path metrics in the detector) allows the additional receiver circuitry needed to convert samples from ADC 2 into two's complement format to be avoided, further simplifying the receiver circuitry.

Various changes and modifications can of course be made to the exemplary embodiments described. For example, while an optimum metric is selected as the smallest metric above, embodiments where an optimum metric is the largest can be envisaged. The functionality described can be readily adapted to accommodate any number of detector states. The set of pipeline stages which calculates the PPM's and candidate PM's may in general comprise one or more pipeline stages. The candidate PM's may be selected over more parallel/serial selection circuits in the sub-PMU's and/or over more parallel sub-PMUs as desired to accommodate more detector states.

Embodiments can also implement sequence detectors other than Viterbi detectors. For example, the principles described can be readily applied to trellis-coded-modulation decoders.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A path metric unit for calculating path metrics, associated with respective states of an n-state trellis, by accumulating branch metrics in a sequence detector, each path metric being represented by N bits plus a wrap-around bit for indicating wrap-around of the N-bit value of that path metric, the path metric unit comprising:
    a set of pipeline stages for receiving said branch metrics and adapted to select, for each state of the trellis, a pair of candidate path metrics from a set of partial path metrics, produced using said branch metrics, for that state; and
    an output pipeline stage connected to receive said pair of candidate path metrics for each state and adapted to produce for that state a select signal, for selecting an optimum one of the pair as the path metric for that state, by comparing each of the N-bit values and the wrap-around bits of the pair;
    wherein said candidate path metrics and select signal for each state are fed back from the output pipeline stage to said set of pipeline stages which is further adapted to produce pairs of speculative partial path metrics for each state by adding corresponding branch metrics to the pairs of candidate path metrics, and to select a said partial path metric from each pair of speculative partial path metrics in dependence on the select signal for the candidate path metrics from which that pair was produced.

2. A path metric unit as claimed in claim 1 wherein said set of pipeline stages is further adapted to select said pair of candidate path metrics for each state from the partial path metrics for that state by comparing each of the N-bit values and the wrap-around bits of pairs of the partial path metrics and selecting an optimum one of each pair until one pair remains as the pair of candidate path metrics for that state.

3. A path metric unit as claimed in claim 2 wherein said set of pipeline stages includes, for each of said pairs of partial path metrics, a selection circuit for selecting said optimum one of the pair, the selection circuit comprising:
    a comparator and an inverting comparator connected for parallel comparison of the N-bit values of the pair;
    an XOR gate, connected in parallel with the comparators, for comparing the wrap-around bits of the pair; and
    a multiplexer circuit adapted to select said optimum one of the pair in dependence on outputs of said comparators and XOR gate.

4. A path metric unit as claimed in claim 3 wherein the output stage comprises, for each state of the trellis, a select-signal circuit comprising:
- a comparator for comparing the N-bit values of the candidate path metrics for that state;
- an XOR gate, connected in parallel with the comparator, for comparing the wrap-around bits of the candidate path metrics for that state; and
- a multiplexer circuit adapted to produce said select signal in dependence on outputs of the comparator and XOR gate of the select-signal circuit.

5. A path metric unit as claimed in claim 1 wherein said set of pipeline stages consists of a single pipeline stage.

6. A path metric unit as claimed in claim 4 wherein said set of pipeline stages consists of a single pipeline stage adapted, for each state of the trellis, to produce four partial path metrics by selection thereof from respective pairs of speculative partial path metrics, said single pipeline stage having two said selection circuits, connected in parallel, to select said candidate path metrics from respective pairs of the partial path metrics.

7. A path metric unit as claimed in claim 1 wherein the output pipeline stage is further adapted to select said optimum one of the pair of candidate path metrics for each state, in dependence on said select signal, as the path metric for that state, and to output the path metric for each state.

8. A sequence detector for detecting symbol values corresponding to a sequence of input samples produced from an analog signal transmitted over a channel and sampled at the channel output, the sequence detector comprising:
- a branch metric unit for receiving the input samples and adapted to calculate, for each input sample and each state of an n-state trellis, branch metrics for respective possible transitions to that state corresponding to the input sample;
- a path memory unit as claimed in claim 1 arranged to receive said branch metrics from the branch metric unit, the path metric unit being further adapted to select, for each state of the trellis, a latest symbol value in a survivor path to that state in dependence on said select signal for that state; and
- a survivor memory unit arranged to receive said latest symbol value in the survivor path to each state from the path metric unit and adapted to select, at the end of said sequence of input samples, a survivor path corresponding to said sequence.

9. A sequence detector as claimed in claim 8, wherein said set of pipeline stages of the path metric unit is further adapted to select said pair of candidate path metrics for each state from the partial path metrics for that state by comparing each of the N-bit values and the wrap-around bits of pairs of the partial path metrics and selecting an optimum one of each pair until one pair remains as the pair of candidate path metrics for that state.

10. A sequence detector as claimed in claim 9 wherein said set of pipeline stages of the path metric unit includes, for each of said pairs of partial path metrics, a selection circuit for selecting said optimum one of the pair, the selection circuit comprising:
- a comparator and an inverting comparator connected for parallel comparison of the N-bit values of the pair;
- an XOR gate, connected in parallel with the comparators, for comparing the wrap-around bits of the pair; and
- a multiplexer circuit adapted to select said optimum one of the pair in dependence on outputs of said comparators and XOR gate.

11. A sequence detector as claimed in claim 10 wherein said output stage of the path metric unit comprises, for each state of the trellis, a select-signal circuit comprising:
- a comparator for comparing the N-bit values of the candidate path metrics for that state;
- an XOR gate, connected in parallel with the comparator, for comparing the wrap-around bits of the candidate path metrics for that state; and
- a multiplexer circuit adapted to produce said select signal in dependence on outputs of the comparator and XOR gate of the select-signal circuit.

12. A sequence detector as claimed in claim 11 wherein said set of pipeline stages of the path metric unit consists of a single pipeline stage.

13. A sequence detector as claimed in claim 8 wherein said input samples are represented in the detector by unsigned binary values.

14. A method for calculating path metrics, associated with respective states of an n-state trellis, by accumulating branch metrics in a sequence detector, each path metric being represented by N bits plus a wrap-around bit for indicating wrap-around of the N-bit value of that path metric, the method comprising:
- receiving said branch metrics and, in a set of pipeline stages, selecting for each state of the trellis a pair of candidate path metrics from a set of partial path metrics, produced using said branch metrics, for that state;
- in an output pipeline stage, receiving said pair of candidate path metrics for each state and producing for that state a select signal, for selecting an optimum one of the pair as the path metric for that state, by comparing each of the N-bit values and the wrap-around bits of the pair; and
- feeding back said candidate path metrics and select signal for each state from the output pipeline stage to said set of pipeline stages and therein producing pairs of speculative partial path metrics for each state by adding corresponding branch metrics to the pairs of candidate path metrics, and selecting a said partial path metric from each pair of speculative partial path metrics in dependence on the select signal for the candidate path metrics from which that pair was produced.

15. A method as claimed in claim 14 including, in said set of pipeline stages, selecting said pair of candidate path metrics for each state from the partial path metrics for that state by comparing each of the N-bit values and the wrap-around bits of pairs of the partial path metrics and selecting an optimum one of each pair until one pair remains as the pair of candidate path metrics for that state.

16. A method as claimed in claim 15 wherein said set of pipeline stages consists of a single pipeline stage.

17. A method as claimed in claim 15 wherein said set of pipeline stages consists of a single pipeline stage, the method including in said single pipeline stage:
- producing, for each state of the trellis, four partial path metrics by selection thereof from respective pairs of speculative partial path metrics; and
- selecting said candidate path metrics in parallel from respective pairs of the partial path metrics.

18. A method as claimed in claim 14 including, in said output pipeline stage, selecting said optimum one of the pair of candidate path metrics for each state, in dependence on said select signal, as the path metric for that state, and outputting the path metric for each state.

* * * * *